United States Patent
Salit et al.

(10) Patent No.: US 9,417,261 B2
(45) Date of Patent: Aug. 16, 2016

(54) ATOMIC REFERENCED OPTICAL ACCELEROMETER

(71) Applicant: Honeywell International Inc., Morristown, NJ (US)

(72) Inventors: Kenneth Salit, Plymouth, MN (US); Mary Salit, Plymouth, MN (US); Robert Compton, Plymouth, MN (US); Jeff A. Ridley, Shorewood, MN (US); Karl Nelson, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 269 days.

(21) Appl. No.: 14/162,697

(22) Filed: Jan. 23, 2014

(65) Prior Publication Data
US 2015/0204899 A1    Jul. 23, 2015

(51) Int. Cl.
| | |
|---|---|
| *G01P 15/093* | (2006.01) |
| *B81B 7/02* | (2006.01) |
| *G01P 15/12* | (2006.01) |
| *G01P 1/00* | (2006.01) |
| *G01P 15/13* | (2006.01) |

(52) U.S. Cl.
CPC ............... *G01P 15/093* (2013.01); *B81B 7/02* (2013.01); *G01P 1/006* (2013.01); *G01P 15/12* (2013.01); *G01P 15/131* (2013.01)

(58) Field of Classification Search
CPC ..... G01P 15/093; G01P 15/131; G01P 15/13; G01P 1/006
USPC ...................................................... 73/514.26
See application file for complete search history.

(56) References Cited

U.S. PATENT DOCUMENTS

| | | | |
|---|---|---|---|
| 4,992,656 A | * 2/1991 | Clauser ........... | G01C 19/58 250/251 |
| 6,018,390 A | 1/2000 | Youmans et al. | |

(Continued)

FOREIGN PATENT DOCUMENTS

| | | |
|---|---|---|
| EP | 2884287 A1 | 6/2015 |
| WO | 0199246 A2 | 12/2001 |

OTHER PUBLICATIONS

Marchant et al., "Off-resonance laser frequency stabilization using the Faraday effect," Optics Letters, vol. 36, No. 1, Jan. 1, 2011, 3 pp.
(Continued)

*Primary Examiner* — Helen Kwok
(74) *Attorney, Agent, or Firm* — Shumaker & Sieffert, P.A.

(57) ABSTRACT

In some examples, a micro-electro-mechanical system (MEMS) optical accelerometer includes a housing comprising an internal chamber that includes a Fabry-Perot cavity and a proof mass affixed to the housing via one or more elastic elements, a light source configured to emit radiation, a first detector configured to receive radiation transmitted through the Fabry-Perot cavity and configured to generate one or more signals that indicate a position of the proof mass. The MEMS optical accelerometer further comprises an atomic wavelength reference and a second detector configured to detect radiation transmitted through the atomic wavelength reference and configured to generate one or more signals that indicate a wavelength of the radiation emitted by the light source, and a servomechanism electrically coupled to the second photo detector and the light source, configured to adjust the light source to maintain the radiation emitted by the light source at approximately a selected wavelength.

19 Claims, 6 Drawing Sheets

(56) References Cited

U.S. PATENT DOCUMENTS

| | | | |
|---|---|---|---|
| 6,473,187 B1 * | 10/2002 | Manalis | G01P 15/093 356/521 |
| 6,763,718 B1 * | 7/2004 | Waters | G01P 15/093 356/506 |
| 6,962,289 B2 | 11/2005 | Vatan et al. | |
| 7,046,841 B1 | 5/2006 | Dow et al. | |
| 7,187,452 B2 | 3/2007 | Jupp et al. | |
| 7,202,776 B2 | 4/2007 | Breed | |
| 7,215,430 B2 | 5/2007 | Kacyra et al. | |
| 7,242,460 B2 | 7/2007 | Hsu et al. | |
| 7,324,205 B2 | 1/2008 | Howard | |
| 7,728,833 B2 | 6/2010 | Verma et al. | |
| 7,796,081 B2 | 9/2010 | Breed | |
| 8,242,851 B2 | 8/2012 | Youngner et al. | |
| 8,258,774 B2 | 9/2012 | Hung et al. | |
| 8,275,194 B2 | 9/2012 | Zebedin | |
| 8,347,720 B2 | 1/2013 | De Los Santos et al. | |
| 2004/0046111 A1 * | 3/2004 | Swierkowski | G01P 15/093 250/227.21 |
| 2006/0066875 A1 * | 3/2006 | Huber | G01P 15/093 356/519 |
| 2008/0163686 A1 * | 7/2008 | Carr | G01L 9/0079 73/514.26 |
| 2009/0109423 A1 * | 4/2009 | Carr | G01L 9/0079 356/73 |
| 2010/0046002 A1 * | 2/2010 | Perez | G01H 9/00 356/478 |
| 2010/0271615 A1 | 10/2010 | Sebastian et al. | |
| 2011/0187466 A1 | 8/2011 | Youngner et al. | |
| 2012/0038902 A1 | 2/2012 | Dotson | |
| 2012/0116709 A1 | 5/2012 | Martin et al. | |
| 2013/0044309 A1 | 2/2013 | Dakin et al. | |
| 2013/0080050 A1 | 3/2013 | McKitterick | |
| 2013/0080064 A1 | 3/2013 | Moldenhauer | |
| 2013/0130742 A1 | 5/2013 | Dietz et al. | |
| 2013/0152680 A1 | 6/2013 | Sackett et al. | |
| 2013/0155047 A1 | 6/2013 | Williams et al. | |
| 2014/0283601 A1 * | 9/2014 | Bhave | G01P 15/093 73/504.12 |
| 2014/0320863 A1 * | 10/2014 | Christensen | G01J 3/45 356/451 |
| 2014/0361768 A1 * | 12/2014 | Overstreet, II | G01C 19/62 324/304 |
| 2015/0160257 A1 * | 6/2015 | Bulatowicz | G01P 15/13 73/514.26 |
| 2015/0346293 A1 * | 12/2015 | Bulatowicz | G01C 19/62 324/305 |

OTHER PUBLICATIONS

Extended Search Report from counterpart European Application No. 15151352.0, dated Jul. 3, 2015, 7 pp.

Lefsky et al. "Lidar Remote Sensing for Ecosystem Studies", Jan. 2002. Article from BioSience, vol. 52. No. 1, 12 pp.

Sun et al. "Forest biomass mapping from lidar and radar synergies". Abstract retrieved on Oct. 28, 2013 from http://www.sciencedirect.com, 1 p.

Yapo et al. "A Probabilistic Representation of LiDAR Range Data for Effecient 3D Object Detection". Rensselaer Polytechnic Institute. IEEE Computer Society Conference on Computer Vision and Pattern Recognition Workshops, 2008. 8 pp.

Goshi et al. "Recent Advances in 94 GHz FMCW Imaging Radar Development". Honeywell International. IEEE MTT-S International Microwave Symposium Digest, 2009. 4 pp.

Waters et al. "Electro-Optical Unltra Sensitive Accelerometer". Apr. 15, 2002. Technical Report performed by SSC San Diego, 10 pp.

Krause et al. "A microchip optomechanical accelerometer". Mar. 27, 2012. California Institute of Technology, and School of Engineering and Applied Sciences, 16 pp.

Hall et al. "Micromachined Accelerometers With Optical Interferometric Read-Out and Integrated Electrostatic Actuation". Feb. 17, 2012. National Institute of Health Public Access. J Microelectromech Syst. Feb. 2008; 17(1): 37-44. doi:10.1109/JMEMS.2007.910243. 24 pp.

Perez et al. "Design and Demonstration of a Bulk Micromachined Fabry—Péro ug-Resolution Accelerometer". IEEE Sensors Journal, vol. 7, No. 12, Dec. 2007. 10 pp.

Fralick, Mark S. "Noise Compensation and Bias Stability Improvement Methods for a Micro-Optical-Electrical-Mechanical Accelerometer". A thesis presented to the Faculty of San Diego State University. Spring, 2012. 120 pp.

Response to the Extended European Search Report and Opinion dated Jul. 3, 2015, from counterpart European Application No. 15151352.0, filed Jan. 28, 2016, 16 pp.

* cited by examiner

ATOMIC REFERENCED OPTICAL ACCELEROMETER

TECHNICAL FIELD

The disclosure relates to optical accelerometers, such as micro-electro-mechanical system (MEMS) optical accelerometers.

BACKGROUND

MEMS accelerometers may be used in various applications, such as in internal measurement units for navigation applications.

SUMMARY

Techniques, devices, and systems described herein are directed toward examples of micro-electro-mechanical system (MEMS) accelerometers. The MEMS accelerometers described herein may be more stable and accurate than conventional MEMS accelerometers. Some example MEMS accelerometers described herein are improved through one or more of temperature stability achieved through the use of heaters, wavelength stability through the use of locking a wavelength of a laser to a resonance wavelength of an atomic wavelength reference, and forced rebalancing of a proof mass.

In one example, a micro-electro-mechanical system (MEMS) optical accelerometer includes a housing comprising an internal chamber that includes a Fabry-Perot cavity, wherein the Fabry-Perot cavity includes a proof mass affixed to the housing via one or more elastic elements. The MEMS optical accelerometer further includes a light source configured to emit electromagnetic radiation into the Fabry-Perot cavity and a first detector configured to receive electromagnetic radiation transmitted through or reflected from the Fabry-Perot cavity from the light source and configured to generate one or more signals that indicate a position of the proof mass. Further, the MEMS optical accelerometer includes an atomic wavelength reference in optical communication with the light source and a second detector configured to detect electromagnetic radiation transmitted through the atomic wavelength reference and configured to generate one or more signals that indicate a wavelength of the electromagnetic radiation emitted by the light source. The MEMS optical accelerometer also includes a servomechanism electrically coupled to the second photo detector and the light source, wherein the servomechanism is configured to adjust the light source to maintain the electromagnetic radiation emitted by the light source at approximately a selected wavelength.

In another example, a micro-electro-mechanical system (MEMS) optical accelerometer system includes a vacuum package which includes a frame comprising an internal chamber that includes a Fabry-Perot cavity, wherein the Fabry-Perot cavity includes a proof mass affixed to the frame via one or more elastic elements. The vacuum package further includes a light source configured to emit electromagnetic radiation into the Fabry-Perot cavity and a first detector configured to receive electromagnetic radiation transmitted through or reflected from the Fabry-Perot cavity from the light source and generate one or more signals that indicate a position of the proof mass. The vacuum package further includes an atomic wavelength reference in optical communication with the light source and a second detector configured to detect electromagnetic radiation transmitted through the atomic wavelength reference and generate one or more signals that indicate a wavelength of the electromagnetic radiation emitted by the light source. The MEMS optical accelerometer system also includes a servomechanism electrically coupled to the second detector and the light source through the vacuum package, wherein the servomechanism is configured to adjust the light source to maintain the electromagnetic radiation emitted by the light source at approximately a resonance wavelength of the atomic wavelength reference.

In yet another example, a method includes determining a wavelength of light emitted by a light source of a micro-electro-mechanical (MEMS) optical accelerometer. The method further includes adjusting, by a servomechanism of the MEMS optical accelerometer, the light source to reduce a difference in the wavelength of light emitted by a light source and a wavelength of the atomic wavelength reference of the MEMS optical accelerometer.

The details of one or more examples of the disclosure are set forth in the accompanying drawings and the description below. Other features, objects, and advantages of the disclosure be apparent from the description and drawings, and from the claims.

BRIEF DESCRIPTION OF DRAWINGS

In accordance with common practice, the various described features are not drawn to scale and are drawn to emphasize features relevant to the present disclosure. Like reference characters denote like elements throughout the figures and text, although some variation may exist between the elements.

DETAILED DESCRIPTION

A micro-electro-mechanical system (MEMS) accelerometer measures acceleration of the accelerometer itself with respect to an inertial reference frame. A MEMS optical accelerometer (referred to herein as an "accelerometer") uses electromagnetic radiation in conjunction with a movable proof mass to determine a magnitude of detected acceleration along the sensing axis. The amount of deflection of the proof mass from a neutral position may be proportionate to the magnitude of the acceleration incident upon the accelerometer. For some applications, highly accurate acceleration measurements are desired. However, the accuracy of some MEMS accelerometers drifts over time. These inaccuracies may arise from bias instabilities due to a change in the physical structure of the device caused by changes in the physical structure of the accelerometer. These changes may occur through aging or time dependent thermal variations and may include changes in the proof mass position due to time dependent thermal variations.

Some example MEMS optical accelerometers devices utilize a laser (or other light source) and one or more Fabry-Perot cavities to detect acceleration using multiple beam interference. The length of the Fabry-Perot cavity (referred to as "cavity A") changes as the proof mass is displaced due to acceleration. The laser provides a beam of light that is partially transmitted through and partially reflected from the Fabry-Perot cavity. One or more detectors are used to monitor the intensity of the reflected and/or transmitted light.

In an optical read-out accelerometer, drift in the frequency of light that the laser emits represents another source of bias instability. A change in the frequency of the light may be indistinguishable from a change in the cavity dimensions, since both errors result in a similar change in the intensity of the light transmitted through the cavity.

Techniques and devices are disclosed herein that compensate for errors due to thermal variations and light source frequency drift. For example, some techniques and devices described herein lock the laser to an atomic reference in order to maintain the wavelength of the laser at approximately a specific, known wavelength. Stabilizing the laser frequency using a feedback system which matches the frequency to an optical resonant frequency for the atoms in a vapor cell, the laser drift error source is reduced. This wavelength-reference vapor cell may be a miniature sealed structure fabricated using MEMS techniques and packed and temperature controlled. In the same enclosure as the proof mass itself.

Techniques, devices, and systems of the present disclosure provide a MEMS optical accelerometer that may be accurate throughout a wide environmental temperature range in which the accelerometer is operating over a long period of time. For example, techniques and devices described herein control the temperature of the proof mass and its support structure, maintaining the temperature at an approximately constant value by controlling the current to heater elements using feedback from a temperature sensing element.

The MEMS optical accelerometers as described herein may be more robust than conventional accelerometers when exposed to time dependent thermal cycles and aging. The accelerometers described herein may have a very high signal to noise ratio (SNR) with very good long term stability, particularly when compared to optical accelerometers without an atomic reference. In addition to being highly stable and less subject to bias drift, the MEMS optical accelerometers described herein have low power requirements and can be small and low in mass.

Different examples of accelerometers described herein may use somewhat different approaches to address the problem bias instabilities due to a change in the physical structure of the device through aging or time dependent thermal variations, which may result in non-acceleration-dependent changes to proof mass position.

For example, a micro-electro-mechanical system (MEMS) optical accelerometer includes a proof mass with a partially-reflecting surface functioning as one mirror of a Fabry-Perot cavity ("proof mass cavity") and affixed to a housing or frame via one or more elastic elements. The opposing mirror of this Fabry-Perot cavity is rigidly attached to the same housing or frame. The system also includes alight source such as a laser, and a detector configured to detect the transmission or reflection of that light source through the proof-mass cavity.

In some examples, the length of the proof-mass cavity is adjusted using a servo mechanism feeding back to, e.g., an electrostatic actuator to control the resonant wavelength for that cavity and keep it matched to the wavelength of the light source, which is itself servo'd to match the resonant wavelength of the atomic sample. This type of closed-loop operation is a form of "force rebalancing."

In one example, a second Fabry Perot cavity, having both of its mirrors rigidly attached to the housing or frame and not having the proof mass in its optical path, functions as a reference to allow thermal expansion or other deformation of the housing or frame to be measured independently of proof mass motion. The length of the reference cavity may be controlled with a temperature actuator like a heater, while the length of the proof mass cavity is controlled by, e.g., an electrostatic actuator. The same light source may be used to interact with both cavities, or each cavity may have its own light source, if the wavelength difference between the two light sources is actively controlled (e.g., by a beat note measurement and servo which keeps the beat note frequency constant). Once the wavelength for the light source which interacts with the reference cavity is locked to an atomic transition, changes in transmission in the reference beam may be fed back to a heater attached to the accelerometer. The heater may apply an appropriate amount of heating to the accelerometer in order to maintain e length of cavity B at an approximately constant length regardless of the ambient temperature to which the accelerometer is exposed.

In some examples, two independent detectors are used to monitor the interaction of the light with the two cavities. The detectors generate signals which are dependent on the optical path lengths of the cavities. In this example, the control of the reference cavity eliminates thermal changes in the dimensions of the assembly which would otherwise be indistinguishable from an acceleration signal, and the force required to maintain the optical path length of the proof mass cavity at a constant value serves as a measure of acceleration.

In another example, a rigid reference cavity is omitted, but the temperature of the proof mass cavity structure is controlled using, for example, a resistive temperature sensor such as a Wheatstone bridge attached to the structure, the output of which is used in a temperature servo to keep the temperature of the structure constant. In these examples, it is assumed that any change in the proof mass cavity resonant frequency is indeed due to acceleration, since thermal expansion of the materials may be negligible.

In another example, both sides of the proof mass are optically reflective, and surfaces attached to the rigid frame on either side of the proof mass are also optically reflective, such that two Fabry-Perot cavities are formed with the proof mass as a common mirror substrate. In this case, two light sources are used, one for each cavity, and a servomechanism measures the difference between the wavelength of one laser and its corresponding cavity, then feeds back to actuators on the proof mass to reduce that difference. Another servomechanism measures the difference between the wavelength of the other laser and a resonant mode of the other cavity, and feeds back to the laser (rather than to the proof mass position) to minimize that difference for the other cavity. In this case, the proof mass position may be read out from the frequency difference between the lasers, measured, for example, front their beat note on an additional detector. This type of two-cavity read out can be used in conjunction with either of the temperature control techniques described herein (that is, a rigid reference cavity or a resistive temperature sensor) and may enable lower-noise readout.

In the examples with a single proof mass cavity and a single laser, true acceleration signals may not be distinguished from drifting of the laser wavelength. The atomic reference cell functions to keep the laser wavelength from drifting. The operation of the reference cell to achieve this is discussed in further detail below. However, in some examples, with two proof mass cavities where two lasers are used to separately measure cavities on each side of the proof mass, an atomic reference cell may not be included because drift of the free-running laser does not show up in the actual beat-note readout. However, if the wavelength drifts too far, the servo mechanism will eventually be unable to lock the cavity resonance to the new wavelength, so a means of wavelength stabilization is desirable even with the "double cavity" approach.

In all of these examples, therefore, an atomic wavelength reference in optical communication with the light source and a detector configured to detect electromagnetic radiation transmitted through the atomic wavelength reference is included, and configured to generate one or more signals that depend upon the wavelength of the electromagnetic radiation emitted by the light source. The MEMS optical accelerometer also includes a servomechanism electrically coupled to the second photo detector and the light source, wherein the servomechanism is configured to adjust the light source to maintain the electromagnetic radiation emitted by the light source at approximately a selected wavelength.

All or part of the micro-electro-mechanical system (MEMS) optical accelerometer system in these examples may be sealed into a package, enclosing a vacuum or partial vacuum. The vacuum envelope may thermally isolate the cavity, reducing the effects of short-time-scale thermal changes in an environment outside the vacuum package, and minimizing energy required to maintain an elevated temperature within the package, relative to the environment.

Figure 1:
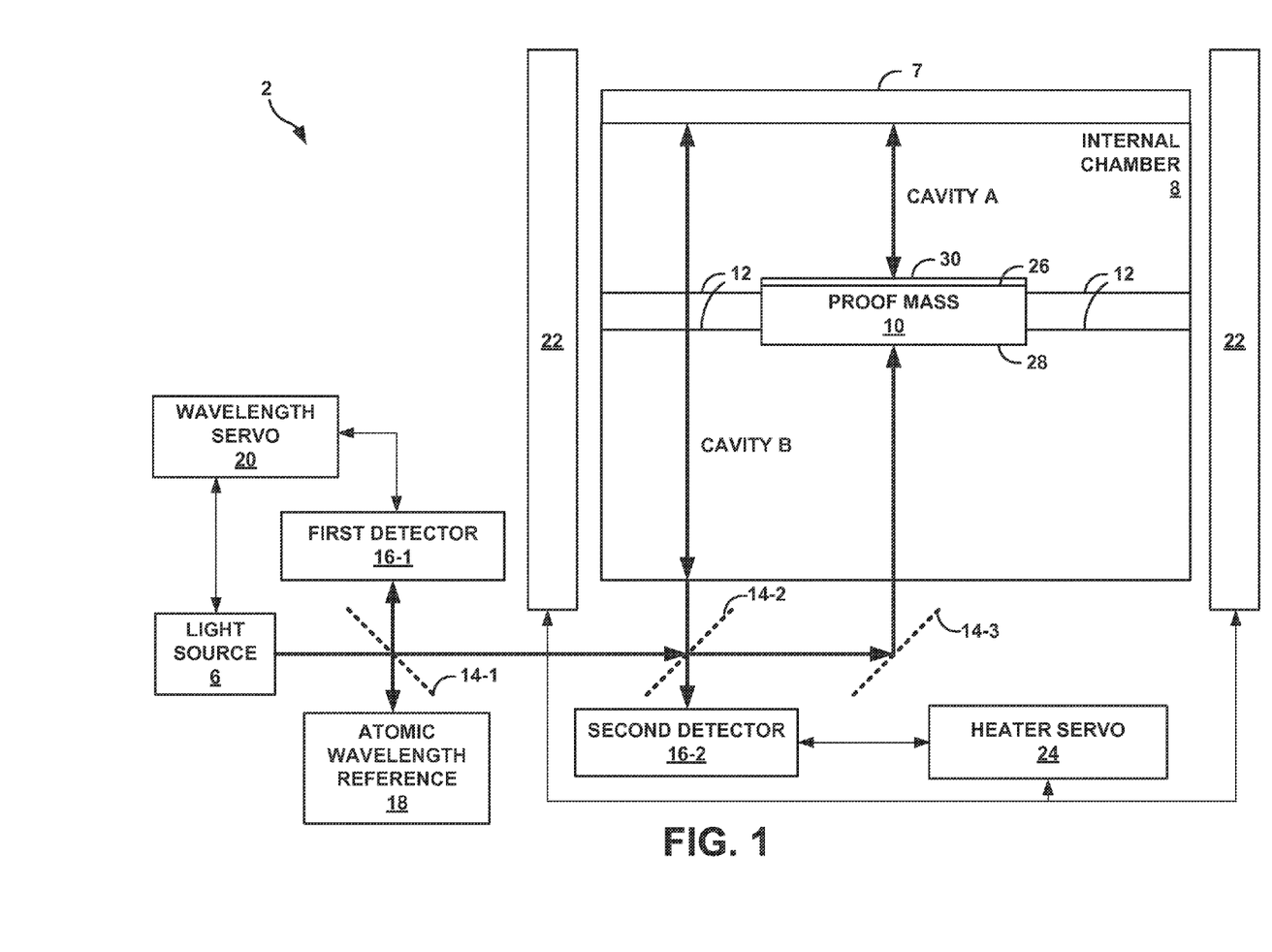
FIG. 1 is a block diagram illustrating an example of a MEMS optical accelerometer, in accordance with one or more aspects of the present disclosure.

FIG. 1 is a block diagram illustrating an example of a MEMS optical accelerometer 2, in accordance with one or more aspects of the present disclosure. MEMS optical accelerometer 2 (referred to herein as "accelerometer 2") is configured to detect acceleration incident upon itself by at least emitting coherent light into a Fabry-Perot interferometer and determining the magnitude of the acceleration based on the transmittance or reflectance of the light, which may be based on movement of a proof mass 10.

Accelerometer 2 includes a light source 6 that emits light into a housing 7 which includes two cavities, cavity A and cavity B, in an internal chamber 8. Housing 7 may be, for example, any suitable housing, such as a ceramic vacuum package. Light source 6 may be any suitable light source configured to emit radiation that can be transmitted through cavities A and B, such as, but not limited to, a laser. In some examples, light source 6 is a micro laser, such as a vertical-cavity surface-emitting laser (VCSEL). A VCSEL is a chip scale laser, which, in some examples, is approximately 400 micrometers (μm) on a side and has a light emitting aperture approximately 3 μm in diameter. Light source 6 emits light at an approximately specific wavelength. The wavelength of light source 6 may be matched to a resonance wavelength of an atomic wavelength reference 18. In addition, the light emitted by light source 6 may, but need not be, in the visible light spectrum.

Atomic wavelength reference 18 may be a hot gas vapor cell that contains an atomic gas exhibiting one or more optical resonance frequencies. Atomic wavelength reference 18 may be, for example, a rubidium (Rb) or cesium (Cs) vapor cell. In other examples, atomic wavelength reference 18 may include any alkali vapor. Atomic wavelength reference 18 (e.g., the atomic gas) will absorb light over specific frequency ranges. Wavelength servomechanism 20 is configured to modulate the frequency (and thus wavelength) of light source 6 around the resonance frequency of atomic wavelength reference 18. First detector 16-1 (for example, a photodiode) is configured to sense the modulated output. Servomechanism 20 may adjust light source 6 based on the sensed modulated output. Wavelength servomechanism 20 may control an intensity modulation of light source 6 around the specific wavelength because atomic wavelength reference 18 absorption varies around that wavelength.

In the example of FIG. 1, cavity A is a Fabry-Perot cavity and includes proof mass 10 which is suspended from housing 7, which may include a frame, one or more elastic elements 12. The frame may act as a support structure. In some examples, the frame may be a lead frame. Cavity A is used to detect a position of proof mass 10, which in turn may be used to determine acceleration incident upon accelerometer 2. Cavity B is a temperature cavity.

Proof mass 10 is a mass that is able to move along a measurement axis when subject to force, such as acceleration. Accelerometer 2 determines a magnitude of the incident acceleration along the measurement axis based on the detected position of proof mass 10. In the absence of errors, the displacement of proof mass 10 from its neutral position is proportional to the incident acceleration. In some examples, a partially reflecting mirror 30 is formed on a side 26 of proof mass 10, which is opposite a side 28 of proof mass 10 that receives incident light from light source 6.

In one example, proof mass 10 is comprised of silicon (Si). In the example of FIG. 1, proof mass 10 is attached to housing 7 via four elastic elements 12. Elastic elements 12 may be comprised of very thin (relative to proof mass 10) stretchable tethers. In some examples, elastic elements 12 are comprised of silicon. Proof mass 10 may be attached to elastic elements 12. Elastic elements 12 are flexible and extend when subject to force. Once the force is removed, elastic elements 12 approximately return to their original length, resulting in proof mass 10 returning to its neutral position (e.g., a position of proof mass 10 in the absence of acceleration forces incident on accelerometer 2). Further, in other examples, different numbers of elastic members 12 may be attached to proof mass 10.

As shown in FIG. 1, light source 6 emits light that reflects from and transmits through three partially reflecting mirrors 14-1, 14-2, and 14-3 (collectively referred to herein as "beam splitters 14"). Beam splitters 14 allow the partial transmission of light while reflecting most of the rest, which creates different paths for the light. The different paths include cavity A (used to determine a position of proof mass 10), cavity B (used to determine a length and thus temperature of internal chamber 8), and a feedback loop for controlling the wavelength of light source 6.

Conventional optical accelerometers tend to have an error mechanism known as laser drift, where, over time, the wavelength of the light the laser emits deviates from the set wavelength. The effect of the laser wavelength changing relative to the proof mass cavity length may be the same as the effect of the cavity length changing relative to the laser wavelength. For this reason, a wavelength drift may not be distinguished from a proof mass position change. The drift thus shows up on the acceleration signal as a bias change. MEMS optical accelerometer 2 is configured to reduce laser drift because the wavelength of light source 6 is locked to the wavelength of atomic wavelength reference 18 using a feedback loop between light source 6, atomic wavelength reference 18, first detector 16-1, and wavelength servomechanism 20.

Beam splitter 14-1 reflects some light emitted by light source 6 to atomic wavelength reference 18 while allowing additional light to transmit to partially reflecting mirror 14-2. Light propagates though the atomic wavelength reference 18 and partially retro-reflects to first detector 16-1. The bi-directional propagation inside atomic wavelength reference 18 causes the intensity of the retro-reflected light to vary with optical frequency near the atomic resonance frequencies in a way that is consistent with saturated absorption spectroscopy. First detector 16-1 may be a photo diode that is configured to generate one or more signals that may be used to determine a wavelength of incident light. First detector 16-1 may be configured to generate one or more signals that indicate a wavelength of the electromagnetic radiation emitted by light source 6. First detector 16-1 may send the one or more signals indicative of the wavelength to wavelength servomechanism 20.

In some examples, wavelength servomechanism ("servo") 20 receives the one or inure signals indicative of the wavelength of the light from light source 6 from first detector 16-1. Wavelength servomechanism 20 may determine the wavelength of the light emitted by light source 6 from the one or more signals. Using the determined wavelength, wavelength servomechanism 20 may adjust light source 6 to maintain the light emitted by light source 6 at approximately a selected wavelength. The selected wavelength may be, for example, a resonance wavelength of atomic wavelength reference 18.

Thermal variations may also cause bias drift unrelated to the optical readout mechanism. Because different components of an accelerometer are composed of different materials, the components may have different coefficients of thermal expansion. Thus, over environmental temperature changes, the components may grow or shrink at different rates, causing changes in the position of proof mass 10 independent of the acceleration and resulting in stress which may, over time, lead to inelastic deformations. To compensate for this source of bias drift, accelerometer 2 maintains an approximately steady temperature using temperature feedback to control one or more heating elements 22.

Accelerometer 2 also includes a feedback loop that may be used to control the temperature of at least a part of accelerometer 2 (e.g., only a portion of accelerometer 2 or entire accelerometer 2), such as internal chamber 8. Light generated by light source 6 and transmitted through beam splitter 14-1 is incident upon beam splitter 14-2, which splits the light toward cavity 13 and beam splitter 14-3. Some of the light that propagates through cavity B is incident upon second detector 16-2. Second detector 16-2 is configured to generate one or more signals (e.g., electrical signals) that indicate a length of cavity B or internal chamber 8. Second detector 16-2 provides the one or more signals that indicate the length to heater servomechanism 24. In turn, heater servomechanism 24 may determine a temperature of internal chamber 8 at least partially based on a known length of internal chamber 8 at a specified temperature. If the temperature of internal chamber 8 is below a selected operating temperature for accelerometer 2, heater servomechanism 24 may cause one or more heating elements 22 to heat internal chamber 8 to reach and maintain the selected operating temperature.

One of more heating elements 22 are configured to change a temperature of at least internal chamber 8 of accelerometer 2. For example, one of more heating elements 2 may be in thermal contact (either directly or indirectly) with housing 7. One or more heating elements 22 are configured to generate heat, and can be, for example, comprised of resistive heating elements, such as one or more resistors. The resistors may be thin film resistors, which may be patterned out of metal directly onto a silicon platform upon which housing 7 is mounted.

In some examples, a Wheatstone bridge may be located on a first side of housing 7 and a second side of housing 7, opposite the first side, as shown in FIG. 1. In another example, other numbers of Wheatstone bridges may be in thermal contact with housing 7, such as, for example, four or six Wheatstone bridges may be mounted on different faces of housing 7. Wheatstone bridges may be comprised of a number of resistors, such as four thin film resistors printed around internal chamber 8. The voltage across the Wheatstone bridges may be sensed and fed back to heater servo 24 which uses the voltage to maintain accelerometer 2 at a relatively stable temperature (e.g., a relatively small temperature range or a specific temperature). In some examples, the Wheatstone bridges include two different resistor materials which have different temperature coefficients of resistance, arranged in an approximately rectangular shape including four corners between each of the resistors. The Wheatstone bridge gives a voltage which is proportional to the temperature across two corners (diagonally opposite), responsive to being driven with a constant voltage across the other two corners. In some examples, accelerometer 2 includes thin metal wires that run across elastic members 12 to make electrical connections to some of the components of accelerometer 50 and out of housing 7, in some examples, the temperature of internal chamber 8 is electronically determined based on the voltages through the Wheatstone bridges, rather than optically determined using cavity B.

The temperature of MEMS optical accelerometer 2 may be, for example, maintained at a selected operating temperature (also referred to herein as "selected temperature") that is higher than the ambient temperature in which accelerometer 2 is positioned. Keeping accelerometer 2 warmer than the surrounding environment reduces the possibility that accelerometer 2 will have to be cooled to maintain it at the selected temperature in case the ambient temperature is warmer than the selected temperature. Not having to cool accelerometer 2 may be beneficial because refrigeration or other cooling techniques can require a relatively large amount of power to operate, can add weight to accelerometer 2, and increase the size of accelerometer 2. Furthermore, because of its relatively small size (e.g., attributable to the relatively compact features used to control drift), heating MEMS optical accelerometer 2 may not require as much power as conventional accelerometers. Also, MEMS optical accelerometer 2 may be packaged in a vacuum package on a thermally isolated frame, which may further reduce power requirements to heat accelerometer 2.

Figure 2A:
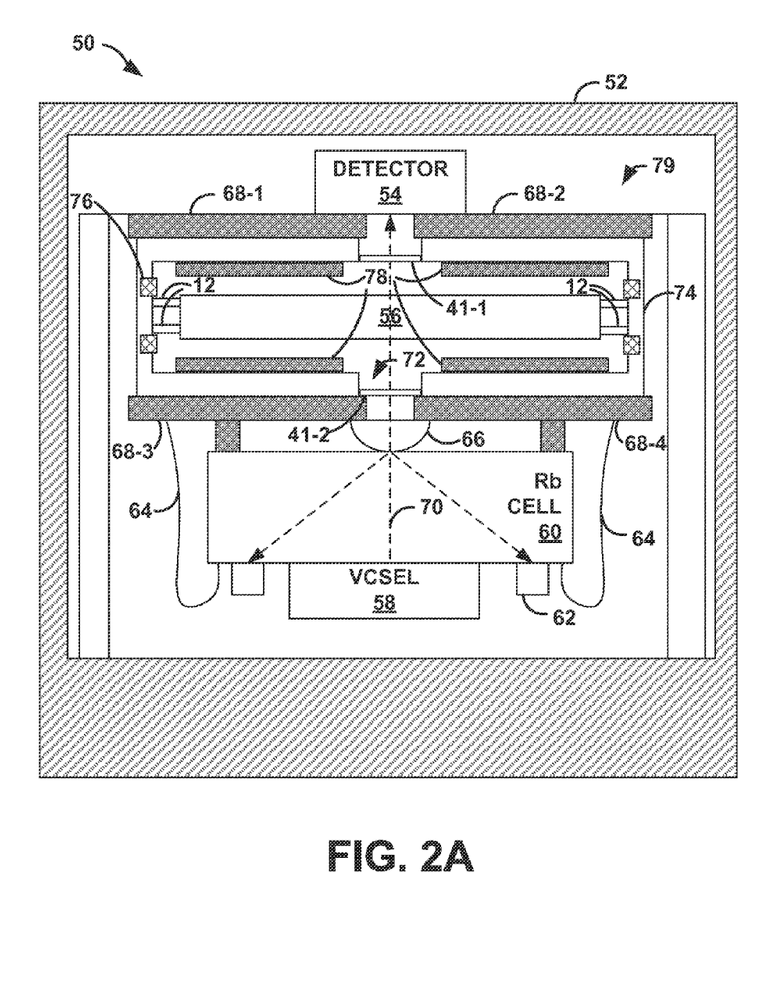
FIG. 2A is a block diagram illustrating a cross section of an example of a temperature compensated and wavelength locked MEMS optical accelerometer, in accordance with one or more aspects of the present disclosure.

FIG. 2A is a block diagram illustrating a schematic cross section of an example of a temperature compensated and wavelength locked MEMS optical accelerometer 50, in accordance with one or more aspects of the present disclosure. MEMS optical accelerometer 50 is also referred to herein as "accelerometer 50" and may contain elements similar to or different from accelerometer 2 of FIG. 1.

Accelerometer 50 includes a housing 52 that may define an internal space 79 which may contain a vacuum or partial vacuum. Housing 52 may also define one or more spaces or vias where electrical connections may be made between components internal to accelerometer 50 contained within housing 52 and external components (such as, for example, servomechanisms which may include one or more processors), while maintaining the vacuum or partial vacuum.

Similar to accelerometer 2 of FIG. 1, accelerometer 50 comprises a light source, VCSEL 58, which emits light 70. VCSEL 58 is a chip scale laser, with dimensions, for example, of approximately 3.3 μm on a side. As VCSEL 58 ages, the wavelength of light 70 may slowly change, resulting in laser drift. Laser drift may translate directly to bias drift. That is, a change in the wavelength of light 70 may be indistinguishable from a change in the position of proof mass 56. Thus, VCSEL 58 is locked to a rubidium (Rb) cell 60. Although Rb cell 60 is shown in FIG. 2A, in other examples, accelerometer 50 can include another atomic gas cell instead of, or in addition to, Rb cell 60. The other atomic gas cell can be, for example, a cesium gas cell.

During operation of accelerometer 50, light 70 emitted by VCSEL 58 propagates through Rb cell 60, which is an atomic wavelength reference. Rb cell 60 is a vapor cell that comprises gaseous rubidium, which has at least one resonance wavelength. Rb cell 60 may be 3 millimeters (mm) on a side. The wavelength of VCSEL 58 is matched to one of the resonance wavelengths of Rb cell 60. Matching the wavelength of VCSEL 58 to Rb cell 60 enables Rb cell 60 to act as a wavelength reference, which may be used to maintain the specific wavelength of VCSEL 58. In the example of FIG. 2A, VCSEL 58 is mounted to, directly or indirectly, Rb cell 60.

Light 70 emitted from VCSEL 58 is incident upon partially reflecting collimation lens 66. Collimation lens 66 is a lens that may be shaped like a dome, hemisphere, or other suitable shape. Collimation lens 66 partially reflects light 70 back through Rb cell 60, whereupon photo detector 62 detects light 70. The portion of light 70 that collimation lens 66 reflects may form a conical shape.

Figure 2B:
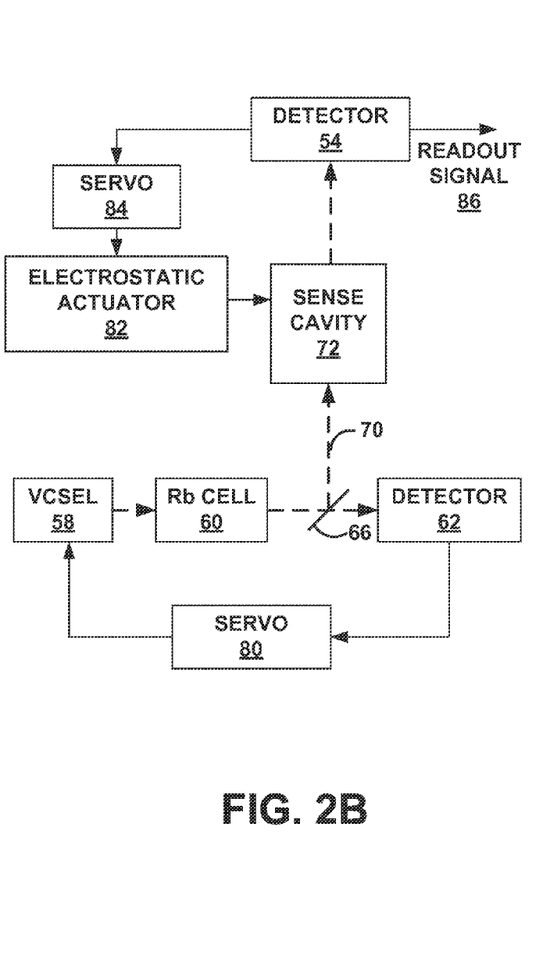
FIG. 2B is a block diagram illustrating one example mode of operation for the MEMS optical accelerometer of FIG. 2A, in accordance with one or more aspects of the present disclosure.

Photo detector 62 may be a ring-shaped photo diode and may be symmetrically located around VCSEL 58. Photo detector 62 receives some light 70 that has transmitted through, and affected by, Rb cell 60. Based on the detected light, photo detector may generate one or more electrical signals indicative of the wavelength of light 70 emitted from VCSEL 58. A servomechanism, such as wavelength servo 20 of FIG. 1 or servo 80 of FIG. 2B, discussed below, may receive the one or more signals from photo detector 62 and determine the wavelength of VCSEL 58 based on the received one or more signals. Based on the determined wavelength, the servo may adjust VCSEL 58 such that it is emitting light 70 at the selected operating wavelength. In the examples of FIGS. 2A and 2B, this servo may be part of or separate from accelerometer 50.

Collimation lens 66 also partially transmits light 70, wherein light 70 transmits through sense cavity 72. For the portion of light 70 that transmits through collimation lens 66, collimation lens 66 converges the portion of light 70, creating a fairly collimated laser beam that preserves its shape as it travels through accelerometer 50. Sense cavity 72 may be a vacuum or partial vacuum, or contain a selected gas. In this example, sense cavity 72 forms a Fabry-Perot cavity that may be used to determine a position of proof mass 56, which in turn may be used to determine acceleration along the axis of measurement.

Similar to proof mass 10 discussed with respect to FIG. 1, proof mass 56 is suspended from frame 74 via elastic elements 12 and is able to move along the axis of measurement. Frame 74 may be a rigid frame that helps form sense cavity 72 and supports some components of accelerometer 50. Support elements 76 may be affixed to frame 74 and support elastic elements 12. In some examples, support elements 76 may be comprised of glass and formed as a layer between two elastic elements 12. Support elements 76 may provide thermal isolation to elastic elements 12 and proof mass 56, and may function similarly as a thermal isolation scaffold in a touch-scale atomic clock. In some examples, support elements 76 comprise silicon with a layer of polyimide. Elastic elements 12 may be thin polyimide tethers that attach the silicon of proof mass 56 to the silicon frame of support elements 76. In some examples, elastic elements 12 are thermal insulators.

In one example, accelerometer 50 further comprises two pieces of silicon 41-1 and 41-2 located at either end of sense cavity 72 in the direction in which light transmits through cavity 72. Each piece of silicon 41-1 and 41-2 may have a mirror coating on the side internal to sense cavity 72. Light 70 may partially transmit through and reflect off silicon 41-1 and 41-2. In some examples, silicon 41-1 and 41-2 extends along surfaces of frame 74. Light 70 may reflect back and forth between the mirrors on silicon 41-1 and 41-2. This serves as the Fabry-Perot cavity and the reflecting light 70 has a resonance frequency.

A detector 54 receives some light 70 that has transmitted through sense cavity 72. Detector 54 may determine the resonance frequency of the Fabry-Perot cavity based on the received light 70 that has been transmitted through sense cavity 72. With the portion of light 70, detector 54 may generate one or more signals that may be used to determine a position of proof mass 56.

Accelerometer 50 may include features configured to help keep proof mass 56 in a neutral position or reset proof mass 56 to the neutral position after movement of proof mass 56 (e.g., in response to acceleration). As described herein, the neutral position of proof mass 56 is the position where elastic elements 12 are not stressed, which may be where proof mass 56 is centered within sense cavity 72. Large accelerations incident upon accelerometer 50 may lead to deformation of elastic elements 12 attached to proof mass 56. Nominally elastic elements 12 may stretch inelastically in high acceleration and not return to their original shape. Acceleration measurements made with stretched elastic elements 12 may not be accurate because proof mass 10 may be displaced from the neutral position when accelerometer 2 is not accelerated.

An electrostatic actuator, such as electrostatic actuator 82 illustrated in FIG. 2B, may apply voltage to conductive elements 78 to create electrostatic fields that keep proof mass 56 in a neutral position. In the example shown in FIG. 2A, accelerometer 50 includes one or more conductive elements 78 attached to frame 74. In some examples where silicon pieces 41-1 and 42-2 extend along frame 74, one or more conductive elements 78 are attached to one of silicon pieces 41-1 and 42-2. Electrostatic actuator 82 may use conductive elements 78 to reset proof mass 56 to a neutral position.

As illustrated in FIG. 2A, conductive elements 78 may be very close to proof mass 56 For example, each conductive element 78 may be within 1 mm of the neutral position of proof mass 56. Conductive elements 78 may be formed in accelerometer 50 using, for example, lithographic techniques. In another example, conductive elements 78 are formed by defining separate spaces in frame 74 or silicon 41-1 and 41-2 in which conductive elements 78 are then placed and affixed.

In some examples, each conductive element 78 may be defined by a metal coating formed on frame 74, on the side closest to proof mass 56. Proof mass 56 may have matching metal coatings formed near the metal coatings of electrostatic actuators 78. By applying appropriate voltages between the metal contacts on an upper electrostatic actuator and a lower electrostatic actuator, the position of proof mass 56 may be controlled, referred to herein as forced rebalancing. A servomechanism such as servo 84 of FIG. 2B, discussed below, may receive one or more signals generated by photo detector 54 and indicative of an acceleration incident upon accelerometer 50. Using the one or more signals, servo 84 may determine what voltages to apply to electrostatic actuators 78 to keep proof mass 56 in the neutral position. The greater the acceleration accelerometer 50 is experiencing, the more force electrostatic actuators 78 exert onto proof mass 56 to keep it in place. If accelerometer 50 is not experiencing acceleration, no forced rebalancing voltage is needed.

This feedback loop may be used to keep proof mass 56 in roughly the same position during operation of accelerometer 50. Keeping proof mass 56 in approximately the same position can help reduce the tendency for elastic elements 12 to deform due to large accelerations and wear over time. The integrity and accuracy of accelerometer 50 may be maintained over a longer period of time by the electrostatic feedback loop resulting in forced rebalancing of proof mass 56 to the zero acceleration position. Forced rebalancing may minimize or help prevent damage to accelerometer 50 due to large accelerations, which could over-stretch elastic elements 12. Also, using electrostatic forces as opposed to magnetic forces require less power over time since a constant current does not need to be maintained.

Forced rebalancing further allows elastic elements 12 to be comprised of thin silicon tethers instead of springs. Using thin silicon tethers as elastic elements 12 instead of stiffer springs may help reduce the weight and cost of accelerometer 50. Further, thin silicon tethers may not transmit as much stress, or transmit stress in the same way, as stiffer springs would. Therefore, elastic elements 12 can enable accelerometer 50 to be less subject to aging, deformation, and other forms of bias that can cause accelerometer 50 to be inaccurate.

By resetting proof mass 56, elastic elements 12 may better maintain their shape and elasticity and accelerometer 50 may be more accurate over a longer period of time. A servomechanism, such as servo 84 of FIG. 2B, discussed below, may receive one or more signals from photo detector 54 that indicate a position of proof mass 56. Using the one or more signals, servo 84 may determine how to reset proof mass 56 to the neutral position using electrostatic actuators 78.

Accelerometer 50 may also include one or more heating elements 68-1 through 68-4 (referred to collectively as "heating elements 68"). The one or more heating elements 68 may be mechanically or thermally coupled to frame 74. One or more heating elements 68 apply heat in order to maintain accelerometer 50 at approximately a constant operating temperature, as discussed above with respect to heating elements 22 of accelerometer 2 shown in FIG. 1.

FIG. 2B is a block diagram illustrating one example mode of operation for the MEMS optical accelerometer of FIG. 2A, in accordance with one or more aspects of the present disclosure. FIG. 2B illustrates some functional components of accelerometer 50 included in housing 52 as well as some components that may be located externally to housing 52. FIG. 2B may show a simplified version of the functionality of accelerometer 50.

In FIG. 2B, dashed lines illustrate a path of light 70 emitted from VCSEL 58, while solid lines illustrate electrical signals transmitted between electronic components. VCSEL 58 emits light 70 which transmits through Rb cell 60 and is incident upon collimation lens 66. Collimation lens 66 splits light 70 towards detector 62 and sense cavity 72. Detector 62 provides one or more signals indicating the wavelength of VCSEL 58 to servomechanism 80. In some examples, detector 62 determines the wavelength of VCSEL 58 using the portion of light 70 it detects. Servomechanism 80 (also referred to herein as "servo 80") may include a processor configured to determine the wavelength of VCSEL 58 from the one or more signals indicative of the wavelength of VCSEL 58. Servo 80 may also determine if VCSEL 58 needs adjusting. Servo 80 may determine that VCSEL 58 needs adjusting by comparing the determined wavelength with the selected operating wavelength (such as, for example, a resonance frequency of Rb cell 60). If the determined wavelength of VCSEL 58 differs from the selected operating wavelength, servo 80 adjusts VCSEL 58 to maintain the wavelength of light 70 at a selected operating wavelength.

The portion of light 70 that travels through sense cavity 72 is incident upon detector 54 and may be used to determine the position of proof mass 56. Detector 54 generates one or more signals indicative of the position of proof mass 56 and outputs readout signal 86. Readout signal 86 may be provided to electronics external to accelerometer 50, such as, for example, a processor in a navigation device. In some examples, the readout for the detector intensity is relatively fast, while the feedback signal to proof mass 56 is relatively slow. The processor may use the one or more signals indicative of the position of proof mass 56 to determine acceleration along the direction of measurement. Detector 54 may also provide one or more signals indicative of the position of proof mass 56 to servomechanism 84. Servo 84 may include one or more processors configured to determine the position of proof mass 56 from the one or more signals. If proof mass 56 has not returned to the neutral position when accelerometer 50 is not experiencing acceleration, servo mechanism 84 may control one or more electrostatic actuators 82 to apply an electrostatic field to sense cavity 72 to reset proof mass 56 to its neutral position.

Figure 3A:
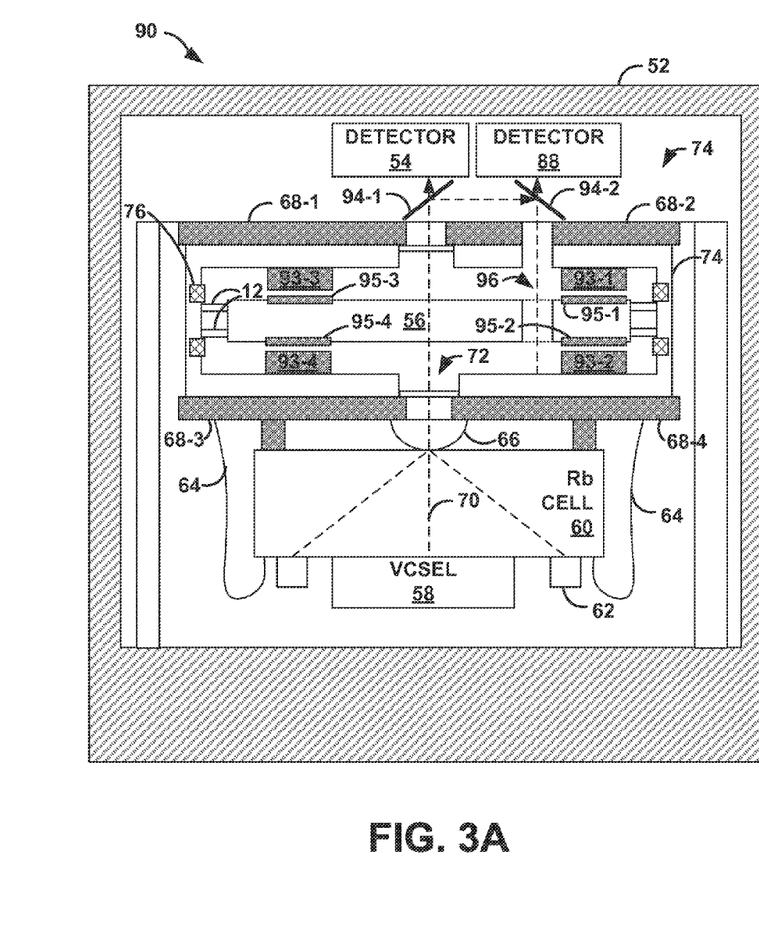
FIG. 3A is a block diagram illustrating a schematic cross section of another example of a temperature compensated and wavelength locked MEMS optical accelerometer, in accordance with one or more aspects of the present disclosure.

FIG. 3A is a block diagram illustrating a schematic cross section of another example of a temperature compensated and wavelength locked MEMS optical accelerometer 90, in accordance with one or more aspects of the present disclosure. Inasmuch as accelerometer 90 is similar to accelerometer 50 of FIG. 2A, those components and aspects are as described above with respect to FIG. 2A. Servo 84 may determine a temperature of accelerometer 90 from the length of an internal cavity, which is then used for temperature stabilization of accelerometer 90.

Accelerometer 90 includes a third detector 88 that detects light 70 transmitted through temperature cavity 96. A first beam splitter 94-1 splits light 70, transmitted from sense cavity 72, toward detector 54 and second beam splitter 94-2. Second beam splitter 94-2 splits light 70 toward temperature cavity 96 and detector 88. First and second beam splitters 94-1 and 94-2 (collectively referred to herein as "beam splitters 94") may be beam splitter cubes or partially reflecting mirrors, for example.

Openings may be formed in heating element 68-2, frame 74, and proof mass 56 to create temperature cavity 96. The portion of light 70 that transmits through temperature cavity 96 may reflect off an upper and lower surface of frame 74 along temperature cavity 96, which may have a reflective surface, such as, for example, through polishing or attaching a reflective material to frame 74. Servo 80 may modulate VCSEL 58 in such a way that aids in determining the length of temperature cavity 96. Detector 88 detects the modulated light and demodulates it to measure the length of temperature cavity 96. For example, if the light is on resonance, modulation sidebands are also transmitted with equal amplitude and opposite phase. Their beat notes with the carrier cancel out. If it is off resonance, the sidebands are transmitted with different amplitudes, and so the beat notes do not cancel out, and the phase of the beat note is opposite for one direction of detuning from resonance than for the other. Demodulating in a phase-sensitive way gives an error signal that can be used to determine the difference between the cavity resonance and the laser frequency, from which the cavity length can be calculated if the laser frequency is known.

Detector 88 receives the reflected light that is transmitted through temperature cavity 96. Based on the detected modulated light, detector 88 generates one or more signals indicative of a length of temperature cavity 96. In some examples, the length of temperature cavity 96 is the same as the internal chamber defined by frame 74 (such as internal chamber 8 of FIG. 1).

Figure 3B:
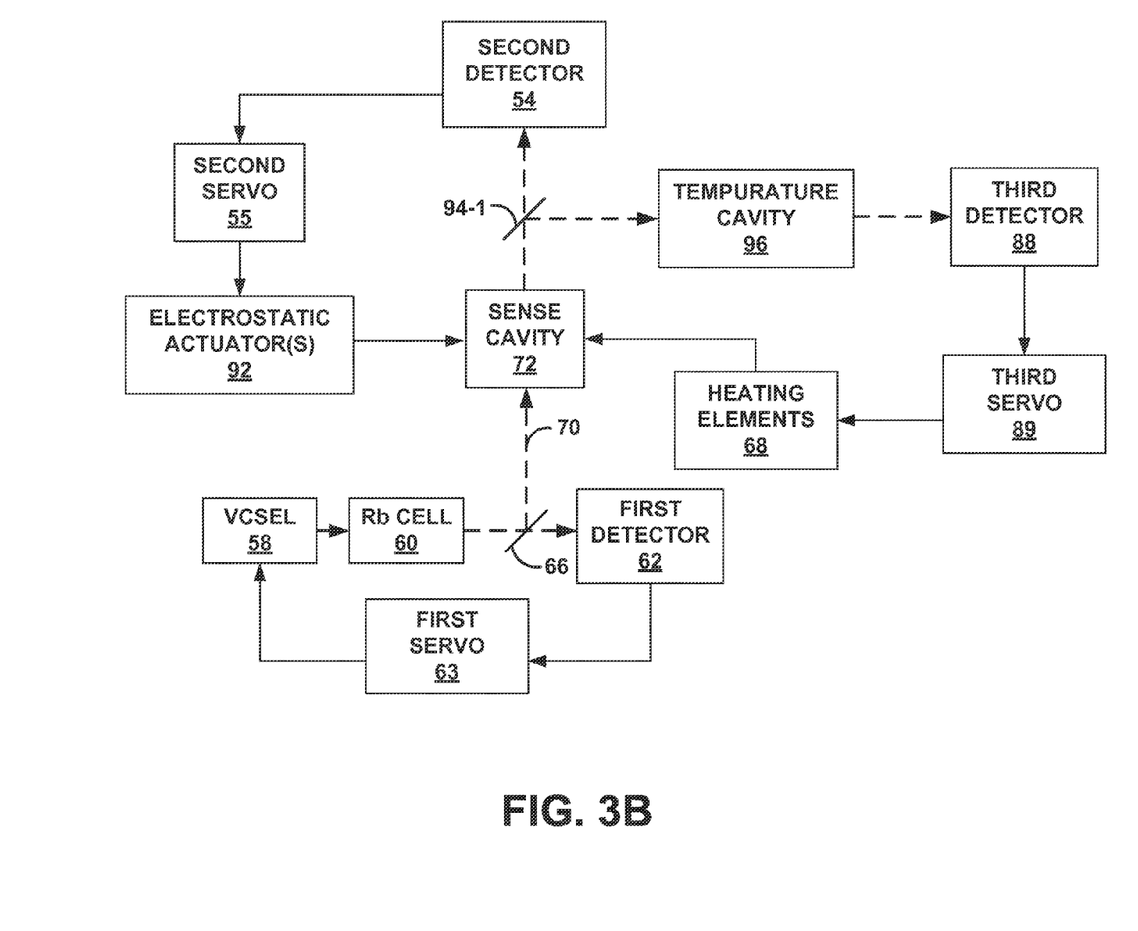
FIG. 3B is a block diagram illustrating one example mode of operation for the MEMS optical accelerometer of FIG. 3A, in accordance with one or more aspects of the present disclosure.

Detector 88 may provide the one or more signals indicative of a length of temperature cavity 96 to a servomechanism, such as a third servo 89 shown in FIG. 3B. Because accelerometer 90 has a relatively stable laser wavelength due to stabilizing VCSEL 58 using the atomic wavelength reference, Rb cell 60, light 70 may be used to measure the length of accelerometer 90, which may change due to temperature changes. The one or more signals indicative of a length of temperature cavity 96 may be fed back to third servo 89 to keep the temperature of accelerometer 90 approximately constant. This example may provide a more direct measurement of the stresses and strains that may be introduced to accelerometer 90 than the feedback system of the example described in FIG. 2A. The example of FIG. 3A provides an optical measurement for temperature instead of a resistive or voltage measurement of the temperature.

Accelerometer 90 includes one or more features configured to help maintain proof mass 56 in a neutral position. In the example shown in FIG. 3A, accelerometer 90 includes four conductive plates 93-1 through 93-4 (collectively referred to herein as "conductive plates 93") placed around proof mass 56 in the direction of measurement. Conductive plates 93 may be formed on or in frame 74. Matching conductive plates 95-1 through 95-4 (collectively referred to herein as "conductive plates 95") may be formed on proof mass 56. Each conductive plate 95 may be located proximate to one of the conductive plates 93. An electrostatic actuator 92 may provide voltage to conductive plates 93 to move proof mass 56 within cavity 72 in order to, e.g., maintain proof mass 56 in a neutral position.

FIG. 3B is a block diagram illustrating one example mode of operation for MEMS optical accelerometer 90 of FIG. 3A, in accordance with one or more aspects of the present disclosure. FIG. 3B illustrates some functional components of accelerometer 90 included in housing 52 as well as some components that may be located externally to housing 52. FIG. 3B may show a simplified version of the functionality of accelerometer 90.

In FIG. 3B, dashed lines illustrate a path of light 70 emitted from VCSEL 58, while solid lines illustrate electrical signals transmitted between electronic components. VCSEL 58 emits light 70 which transmits through Rb cell 60 and is incident upon collimation lens 66. Collimation lens 66 splits light 70 towards detector 62 and sense cavity 72. First servomechanism 63 uses the portion of light 70 that is detected by first detector 62 is used to determine the wavelength of VCSEL 58. First detector 62 transmits one or more signals indicating the wavelength of VCSEL 58 to first servomechanism 63. First servomechanism 63 may process the one or more signals to determine the wavelength of VCSEL 58 and to further determine if VCSEL 58 needs adjusting. If so, first servo 63 adjusts VCSEL 58 to maintain the wavelength of light 70 at a selected operating wavelength, which may he similar to a resonance wavelength of Rb cell 60.

Some portion of light 70 that travels through sense cavity 72 is incident upon second detector 54 and may be used to determine the acceleration incident upon accelerometer 90. Second detector 54 generates one or more electrical signals indicative of the acceleration, which may be the position of proof mass 56, and outputs readout signal 86. Readout signal 86 may be provided to electronics external to accelerometer 50, such as, for example, a processor in a navigation device. The processor may use the one or more signals to determine acceleration along the direction of measurement.

Second detector 54 may also provide the one or more electrical signals indicative of the position of proof mass 56 to second servomechanism 55. Second servo 55 may determine the acceleration from the one or more signals and further determine what voltage to provide to one or more electrostatic actuators 92 to apply an electrostatic field to maintain proof mass 56 in a neutral position. Second servo 55 applies more voltage to electrostatic actuators 92 in greater accelerations to keep proof mass 56 from displacing from the neutral position.

Beam splitter 94-1 may direct a portion of light 70 toward temperature cavity 96, which reflects back to third detector 88. Third detector 88 provides one or more signals indicative of a length of temperature cavity 96 to third servomechanism 89. Third servomechanism 89 may include one or more processors configured to determine the temperature of accelerometer 90 from the one or more signals from third detector 88 and controls one or more heating elements 68 to stabilize the temperature of accelerometer 90.

Figure 4:
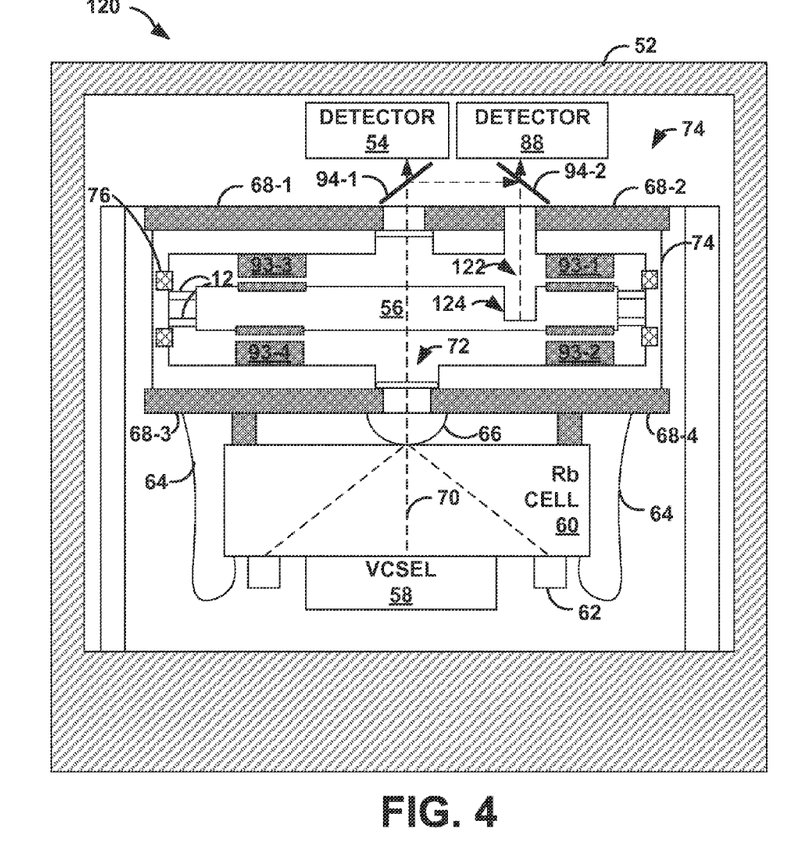
FIG. 4 is a block diagram illustrating a schematic cross section of an example of a MEMS optical accelerometer with differential measurement of proof mass position, in accordance with one or more aspects of the present disclosure.

FIG. 4 is a block diagram illustrating a schematic cross section of an example of a temperature compensated and wavelength locked MEMS optical accelerometer 120 with differential measurement of proof mass 56 position, in accordance with one or more aspects of the present disclosure. Inasmuch as accelerometer 120 is similar to accelerometer 50 of FIG. 2A and accelerometer 90 of FIG. 3A, those components and aspects are as described above with respect to FIG. 2A or FIG. 3A.

Accelerometer 120 includes a cavity 122 that may be used to determine a position of proof mass 56. A recess 124 is formed in proof mass 56. Cavity 122 is formed on a first side of proof mass 56 and a surface of frame 74. Detector 88 may generate one or more signals that may be used to determine a differential measurement of the position of proof mass 56. Differentially measuring the position of proof mass 56 may reduce certain types of noise that may be present in the output of accelerometer 120.

In some examples, a second cavity is formed between a second surface of proof mass 56 and frame 74. In this example, instead of detecting resonance by measuring the amplitude and phase of the modulation on the transmitted beam, the amplitude and phase of the modulation on the reflected beam is measured.

In some examples, accelerometer 120 may be temperature stabilized. The temperature of accelerometer 120 may be measured electrically (for example, such as in FIG. 2A) or optically (for example, such as in FIG. 3A). Additionally, in some examples, VCSEL 58 may be wavelength stabilized, such as described in FIGS. 1-3B.

Figure 5:
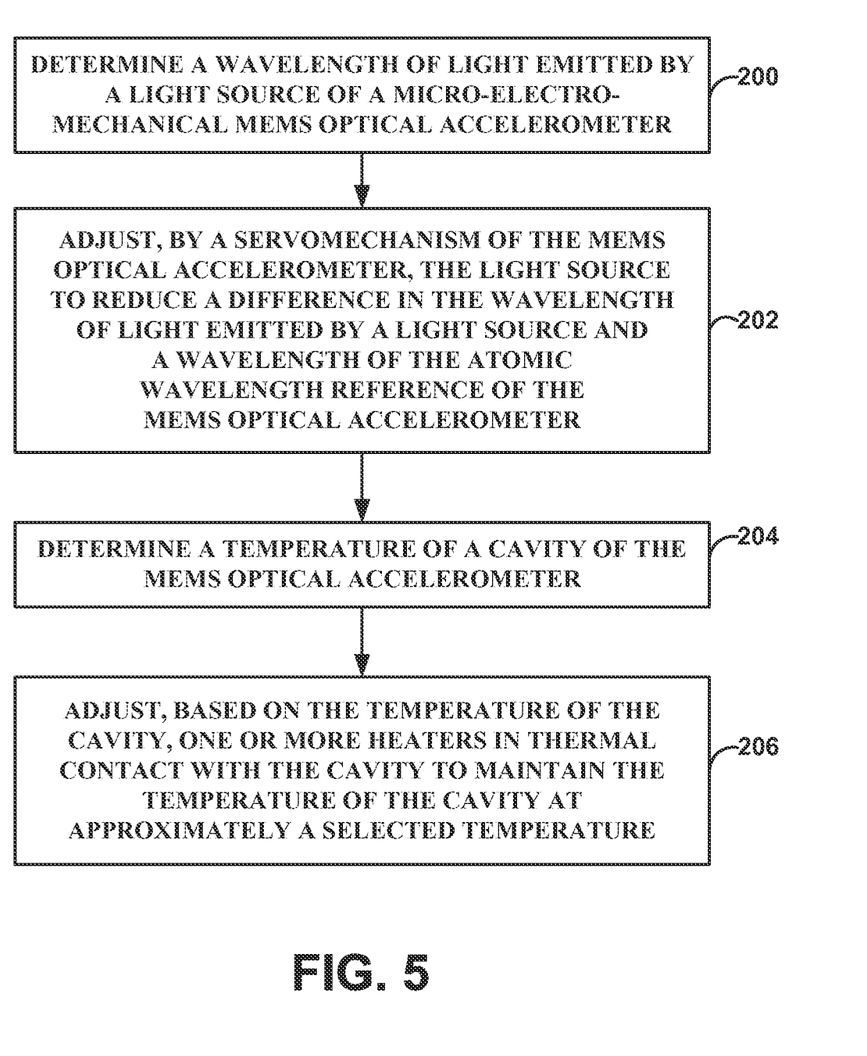
FIG. 5 is a flowchart illustrating an example method of operating a MEMS optical accelerometer, in accordance with one or more aspects of the present disclosure.

FIG. 5 is a flowchart illustrating an example method of operating a MEMS optical accelerometer, in accordance with one or more aspects of the present disclosure. As discussed herein, the method is described with respect to the examples of MEMS optical accelerometers 2, 50, 90, and 120 as described with respect to FIGS. 1-4. However, the method may apply to other accelerometer examples of the present disclosure as well.

In the example shown in FIG. 5, the method includes determining a wavelength of light emitted by a light source of a micro-electro-mechanical (MEMS) optical accelerometer (200). For example, first detector 62 of accelerometer 90 receives reference light, light emitted from VCSEL 58 that has propagated through Rb cell 60. First servo 63 determines the wavelength of the emitted light based on the reference light.

The method may further include adjusting, by a servomechanism of the MEMS optical accelerometer, the light source to reduce a difference in the wavelength of light emitted by a light source and a wavelength of the atomic wavelength reference of the MEMS optical accelerometer (202). In one example, adjusting the light source includes locking a wavelength of light emitted by a laser of the MEMS optical accelerometer to a wavelength of an atomic wavelength reference. For example, the wavelength of emitted light 70 of VCSEL 58 of MEMS optical accelerometer 50 may be locked to a resonance wavelength of Rb cell 60. A servomechanism, such as servo 80, may modulate and demodulate the frequency of VCSEL 58 may be around a resonance frequency of rubidium such that sensing the modulated output with a photodiode may be used to determine the wavelength of light 70 that VCSEL, 58 emits.

The method may further include a servomechanism, such as third servo 89, determining a temperature of a cavity of the MEMS optical accelerometer (204). The temperature of the cavity may be determined in a number of ways. For example, as illustrated in FIG. 2A, temperature may be determined electrically by sensing voltage across one or more Wheatstone bridges 68. In another example, for example, that of FIG. 3A, temperature may be determined optically by sensing the length of temperature cavity 96.

The method may further include a servomechanism, such as first servo 63, adjusting, based on the temperature of the cavity, one or more heaters in thermal contact with the cavity to maintain the temperature of the cavity at approximately a selected temperature (206). The selected operating temperature may be a temperature above an ambient temperature of the environment accelerometer In some examples, the laser is a VCSEL, such as VCSEL 58. Locking the wavelength of the light emitted by the. VCSEL may further include receiving, by a photo detector of the MEMS optical accelerometer, reference light, wherein the reference light is emitted light that has been transmitted through the atomic wavelength reference. The method further includes determining a difference in the wavelength of the emitted light and the resonant wavelength of the atomic wavelength reference. The method may further include a servomechanism adjusting the VCSEL to reduce the difference in the wavelength of the emitted light and the resonant wavelength of the atomic wavelength reference.

In some examples, determining the temperature further includes determining a length of a temperature cavity using the light emitted by the. VCSEL and determining the temperature based on the length of the temperature cavity.

In additional examples, the method further comprises determining a position of a proof mass in the cavity of the MEMS optical accelerometer. Based on the position of the proof mass, the method further comprises adjusting the position of the proof mass to maintain the proof mass in a neutral position, In some examples, the photo detector is a first photo detector. Determining the position of the proof mass may further comprise receiving, by a second photo detector of the MEMS optical accelerometer, electromagnetic radiation from the light source that has transmitted through a cavity partially formed by a recess in the proof mass. The method may further comprise differentially determining the position of the proof mass based on difference between the electromagnetic radiation received by the first and second photo detectors.

In some examples, the one or more heating elements are one or more Wheatstone bridges. Adjusting the one or more heating elements further comprises providing voltage to the one or more Wheatstone bridges based on he temperature of the cavity to maintain the temperature of the cavity at approximately the selected temperature.

The example accelerometers described herein have less bias drift than conventional accelerometers. The accelerometers may have less bias drift due to one or more of temperature stability, laser wavelength stability, and forced rebalancing of the proof mass. The accelerometers may also have more accuracy over a longer lifetime. The accelerometers as described herein are well suited for applications that are sensitive to bias drift, such as precision navigation, applications that have long missions where an accelerometer may not be removed, exchanged, or recalibrated, and applications where components may have to sit inactive for long time periods but be ready to use at any moment. An accelerometer as described herein may have a good signal to noise ratio, high precision, high resolution, high accuracy, and high stability.

In the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality with respect to an external frame of reference as used herein. The term "about," "approximate," or the like indicates that the value listed may be somewhat altered, as long as the alteration does not result in nonconformance of the process or structure to the illustrated example.

Terms of relative position as used in this disclosure are defined based on a plane parallel to the conventional plane or working surface of proof mass 10 or 56, regardless of the orientation of proof mass 10 or 56. The tern "horizontal" as used in this disclosure is defined as a plane parallel to the conventional plane or working surface of proof mass 10 or 56, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the proof mass 10 or 56, regardless of the orientation of proof mass 10 or 56.

In one or more examples, some of the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to tangible computer-readable storage media which is non-transitory. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

Various aspects of the disclosure have been described. Aspects or features of examples described herein may be combined with any other aspect or feature described in another example. These and other examples are within the scope of the following claims.

What is claimed is:

1. A micro-electro-mechanical system (MEMS) optical accelerometer, comprising:
    a housing comprising an internal chamber that includes:
        a Fabry-Perot cavity, wherein the Fabry-Perot cavity includes a proof mass affixed to the housing via one or more elastic elements; and
        a temperature cavity;
    a light source configured to emit electromagnetic radiation into the Fabry-Perot cavity;
    a first detector configured to receive electromagnetic radiation transmitted through or reflected from the Fabry-Perot cavity from the light source and configured to generate one or more signals that indicate a position of the proof mass;
    an atomic wavelength reference in optical communication with the light source;
    a second detector configured to detect electromagnetic radiation transmitted through the atomic wavelength reference and configured to generate one or more signals that indicate a wavelength of the electromagnetic radiation emitted by the light source;
    a first servomechanism electrically coupled to the second detector and the light source, wherein the servomechanism is configured to adjust the light source to maintain the electromagnetic radiation emitted by the light source at approximately a selected wavelength;
    a third detector configured to detect electromagnetic radiation transmitted through the temperature cavity from the light source and configured to generate one or more signals that indicate a temperature of the internal chamber;
    one or more heating elements in thermal contact with the housing; and
    a second servomechanism configured to receive the one or more signals that indicate the temperature of the internal chamber and configured to control the one or more heating elements to control the temperature of the internal chamber.

2. The MEMS optical accelerometer of claim 1, wherein the selected wavelength is approximately a resonance wavelength of the atomic wavelength reference, and wherein the atomic wavelength reference is one of a rubidium (Rb) vapor cell or a cesium (Cs) vapor cell.

3. The MEMS optical accelerometer of claim 1, wherein the light source is a vertical-cavity surface-emitting laser (VCSEL).

4. The MEMS optical accelerometer of claim 1, further comprising:
    one or more Wheatstone bridges, wherein resistance in the one or more Wheatstone bridges is related to temperature of at least part of the MEMS optical accelerometer.

5. The MEMS optical accelerometer of claim 1, further comprising:
    one or more conductive plates configured to apply an electrostatic field to approximately maintain the proof mass in a neutral position.

6. The MEMS optical accelerometer of claim 5, further comprising:
    an electrostatic actuator that receives the one or more signals that indicate the position of the proof mass and is configured to provide a voltage to the one or more conductive plates in order to maintain the position of the proof mass in approximately the neutral position.

7. The MEMS optical accelerometer of claim 1, wherein the second detector is a ring-shaped photo diode, the MEMS optical accelerometer further comprising:
    a partially reflecting collimation lens located between the atomic wavelength reference and the Fabry-Perot cavity, wherein the electromagnetic radiation transmitted through the atomic wavelength reference is reflected from the collimation lens.

8. The MEMS optical accelerometer of claim 1, wherein the proof mass further comprises a recess, the MEMS optical accelerometer further comprising:
    one or more conductive plates positioned around the proof mass;
    a fourth detector in line with the recess and configured to receive electromagnetic radiation transmitted through a cavity formed by the recess and generate one or more signals indicative of a differential measurement of a position of the proof mass; and
    an electrostatic actuator configured to receive the one or more signals indicative of the differential measurement of the position of the proof mass and provide a voltage to the one or more conductive plates positioned around the proof mass in order to maintain the position of the proof mass in approximately a neutral position.

9. The MEMS optical accelerometer of claim 1, further comprising:
a vacuum package that houses the housing, the light source, the first detector, the atomic wavelength reference, and the second detector in a vacuum chamber.

10. A micro-electro-mechanical system (MEMS) optical accelerometer system, comprising:
a vacuum package comprising:
a frame comprising an internal chamber that includes:
a Fabry-Perot cavity, wherein the Fabry-Perot cavity includes a proof mass affixed to the frame via one or more elastic elements; and
a temperature cavity;
a light source configured to emit electromagnetic radiation into the Fabry-Perot cavity;
a first detector configured to receive electromagnetic radiation transmitted through or reflected from the Fabry-Perot cavity from the light source and generate one or more signals that indicate a position of the proof mass;
an atomic wavelength reference in optical communication with the light source; and
a second detector configured to detect electromagnetic radiation transmitted through the atomic wavelength reference and generate one or more signals that indicate a wavelength of the electromagnetic radiation emitted by the light source; and
a first servomechanism electrically coupled to the second detector and the light source through the vacuum package, wherein the servomechanism is configured to adjust the light source to maintain the electromagnetic radiation emitted by the light source at approximately a resonance wavelength of the atomic wavelength reference;
a third detector configured to detect electromagnetic radiation transmitted through the temperature cavity from the light source and configured to generate one or more signals that indicate a temperature of the internal chamber; and
one or more heating elements in thermal contact with the frame;
a second servomechanism configured to receive the one or more signals that indicate the temperature of the internal chamber and configured to control the one or more heating elements to control the temperature of the internal chamber.

11. The MEMS optical accelerometer system of claim 10, wherein the light source is a vertical-cavity surface-emitting laser (VCSEL), wherein the atomic wavelength reference is one of a rubidium (Rb) vapor cell or a cesium (Cs) vapor cell, wherein the one or more heating elements comprises one or more Wheatstone bridges.

12. The MEMS optical accelerometer system of claim 10, the vacuum package further comprising one or more conductive plates configured to apply an electrostatic field to approximately maintain the proof mass in a neutral position, wherein the MEMS optical accelerometer system further comprises an electrostatic actuator that receives the one or more signals that indicate the position of the proof mass and is configured to provide a voltage to the one or more conductive plates in order to maintain the position of the proof mass in approximately the neutral position.

13. A method comprising:
determining a wavelength of light emitted by a light source of a micro-electro-mechanical (MEMS) optical accelerometer; and
adjusting, by a servomechanism of the MEMS optical accelerometer, the light source to reduce a difference in the wavelength of light emitted by the light source and a wavelength of an atomic wavelength reference of the MEMS optical accelerometer; and
determining a temperature of a cavity of the MEMS optical accelerometer; and
adjusting, based on the temperature of the cavity, one or more heating elements in thermal contact with the cavity to control the temperature of the cavity.

14. The method of claim 13, wherein determining a wavelength of light emitted by the light source further comprises:
receiving, by a first photo detector of the MEMS optical accelerometer, reference light, wherein the reference light is emitted light that has been transmitted through the atomic wavelength reference, and
determining a wavelength of the emitted light based on the reference light, and wherein the method further comprises determining the difference in the wavelength of the emitted light and the wavelength of the atomic wavelength reference.

15. The method of claim 13, wherein the one or more heating elements comprise one or more resistors, wherein adjusting the one or more heating elements further comprises:
providing a voltage to the one or more resistors based on the temperature of the cavity to maintain the temperature of the cavity at approximately the selected temperature.

16. The method of claim 14, further comprising:
determining a position of a proof mass in the cavity of the MEMS optical accelerometer; and
adjusting the position of the proof mass to maintain the proof mass in a neutral position.

17. The method of claim 16, wherein determining the position of the proof mass further comprises:
receiving, by a second photo detector of the MEMS optical accelerometer, electromagnetic radiation from the light source that has transmitted through a cavity partially formed by a recess in the proof mass; and
differentially determining the position of the proof mass based on the electromagnetic radiation received by the second photo detector.

18. The MEMS optical accelerometer of claim 1, wherein to control the temperature of the internal chamber, the second servomechanism is further configured to maintain the internal temperature at approximately a selected temperature.

19. The MEMS optical accelerometer system of claim 10, wherein to control the temperature of the internal chamber, the second servomechanism is further configured to maintain the internal temperature at approximately a selected temperature.

* * * * *